US009222707B2

(12) United States Patent
Ayotte et al.

(10) Patent No.: US 9,222,707 B2
(45) Date of Patent: Dec. 29, 2015

(54) TEMPERATURE STABILIZATION IN SEMICONDUCTORS USING THE MAGNETOCALORIC EFFECT

(71) Applicant: International Business Machines Corporation, Armonk, NY (US)

(72) Inventors: Stephen P. Ayotte, Essex Junction, VT (US); Nicholas G. Clore, Essex Junction, VT (US); Michael C. Johnson, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 367 days.

(21) Appl. No.: 13/766,846

(22) Filed: Feb. 14, 2013

(65) Prior Publication Data

US 2014/0223922 A1  Aug. 14, 2014

(51) Int. Cl.
F25D 21/00 (2006.01)
F25B 21/00 (2006.01)

(52) U.S. Cl.
CPC . *F25B 21/00* (2013.01); *Y02B 30/66* (2013.01)

(58) Field of Classification Search
CPC ................................. F25B 21/00; Y02B 30/66
USPC .......................................... 62/3.1, 3.2, 259.2
See application file for complete search history.

(56) References Cited

U.S. PATENT DOCUMENTS

| 5,714,829 | A | 2/1998 | Guruprasad |
| 6,261,871 | B1 | 7/2001 | Langari et al. |
| 6,588,216 | B1 * | 7/2003 | Ghoshal .......................... 62/3.1 |
| 8,375,727 | B2 * | 2/2013 | Sohn .................................. 62/3.1 |
| 2004/0182086 | A1 | 9/2004 | Chiang et al. |
| 2009/0025598 | A1 * | 1/2009 | Menser et al. .................. 104/93 |
| 2011/0016885 | A1 | 1/2011 | Zhang et al. |

FOREIGN PATENT DOCUMENTS

| EP | 133710 B1 | 12/2007 |
| JP | 2002356748 | 12/2002 |
| WO | 2004059221 | 7/2004 |

OTHER PUBLICATIONS

Kim et al., "Design, fabrication and thermal characterization of a magnetocaloric microcooler", Int. J. Energy Res. (2007) 31:pp. 717-727.

T.Tsukamoto et al., "Experimental estimation of cooling power of a solid state micro magnetic refrigerator using La (FexSi1-x)13Hy", 25th International IEEE Micro Electro Mechanical Systems (MEMS) Conference, pp. 1125-1228, 2012.

(Continued)

*Primary Examiner* — Melvin Jones
(74) *Attorney, Agent, or Firm* — Gibb & Riley, LLC; David A. Cain, Esq.

(57) ABSTRACT

Apparatus and methods incorporate magnetocaloric materials in integrated circuit chip-carrier structures for electronic packages. An integrated circuit chip is electrically connected to a substrate. A thermostabilization unit is physically connected to the integrated circuit chip and the substrate. The thermostabilization unit comprises a temperature detector and magnetocaloric material on the integrated circuit chip. The integrated circuit structure includes a magnetic field generator operatively connected to the temperature detector. The magnetic field generator generates a magnetic field of variable intensity responsive to changes in temperature detected by the temperature detector.

20 Claims, 4 Drawing Sheets

(56) References Cited

OTHER PUBLICATIONS

Pereira et al., "Simulations of refrigeration on integrated circuits using micro-channels", Journal of Non-Crystalline Solids 354 (2008) pp. 5295-5297.
Silva et al., "Solid state magnetic refrigerator", Applied Energy 93 (2012) pp. 570-574.
Kitanovski and Egolf, "Innovative ideas for future research on magnetocaloric technologies", Intl. J. of Refrigeration, vol. 33 (2010), pp. 449-464.
Krenke et al., "Inverse Magnetocaloric Effect in Ferromagnetic Ni—Mn—Sn Alloys", pp. 1-12, Feb. 1, 2013.
Phan et al., "Review of the Magnetocaloric Effect in Manganite Materials", Jornal of Magnetism and Magnetic Materials vol. 308, 2007, pp. 325-340.

* cited by examiner

TEMPERATURE STABILIZATION IN SEMICONDUCTORS USING THE MAGNETOCALORIC EFFECT

BACKGROUND

The present disclosure relates to temperature stabilization for semiconductor devices. More particularly, the disclosure relates to semiconductor devices that incorporate magnetocaloric materials in integrated circuit chip-carrier structures for electronic packages.

As the performance, speed, and complexity of semiconductor devices increase, the semiconductor devices tend to increasingly generate significant amounts of heat. The heat generated by operating semiconductors can lower their operating life and/or performance. In order to draw heat away from the semiconductors, various solutions have been fabricated. These include a simple passive heat sink, a forced air heat sink, or possibly a water-cooled system. However, the continually shrinking packaging containing semiconductor devices has contributed to a reduction of the ability of these devices to dissipate heat through convection and other means. The space surrounding these semiconductor devices has become significantly more confined as packaging sizes shrink, thereby reducing the opportunity for convection currents to circulate and remove heat.

At the other end of the temperature spectrum, operating semiconductors at sub ambient temperature can also adversely affect their reliability. Operating at extreme high or low temperatures can lead to poor performance and reduced reliability.

SUMMARY

According to an integrated circuit structure, an integrated circuit chip is provided on a substrate. The integrated circuit chip is electrically connected to the substrate. A thermostabilization unit is physically connected to the integrated circuit chip and the substrate. The thermostabilization unit comprises a temperature detector and magnetocaloric material on the integrated circuit chip. The integrated circuit structure includes a magnetic field generator operatively connected to the temperature detector. The magnetic field generator generates a magnetic field of variable intensity responsive to changes in temperature detected by the temperature detector.

According to a method herein, a semiconductor chip is connected to a substrate. Magnetocaloric material is provided on the substrate. A temperature of the semiconductor chip is detected. A magnetic field around the substrate is controlled to adjust the temperature of the magnetocaloric material.

According to another method herein, a semiconductor chip is connected to a substrate. A thermostabilization unit is connected to the substrate. The thermostabilization unit comprises a temperature detector, magnetocaloric material on the substrate, and a magnetic field generator operatively connected to the temperature detector. A temperature of the semiconductor chip is detected. Responsive to changes in the temperature detected by the temperature detector, the magnetic field generator generates a magnetic field of variable intensity around the substrate to adjust the temperature of the magnetocaloric material.

BRIEF DESCRIPTION OF THE DRAWINGS

The devices and methods herein will be better understood from the following detailed description with reference to the drawings, which are not necessarily drawn to scale and in which.

DETAILED DESCRIPTION

Figure 1:
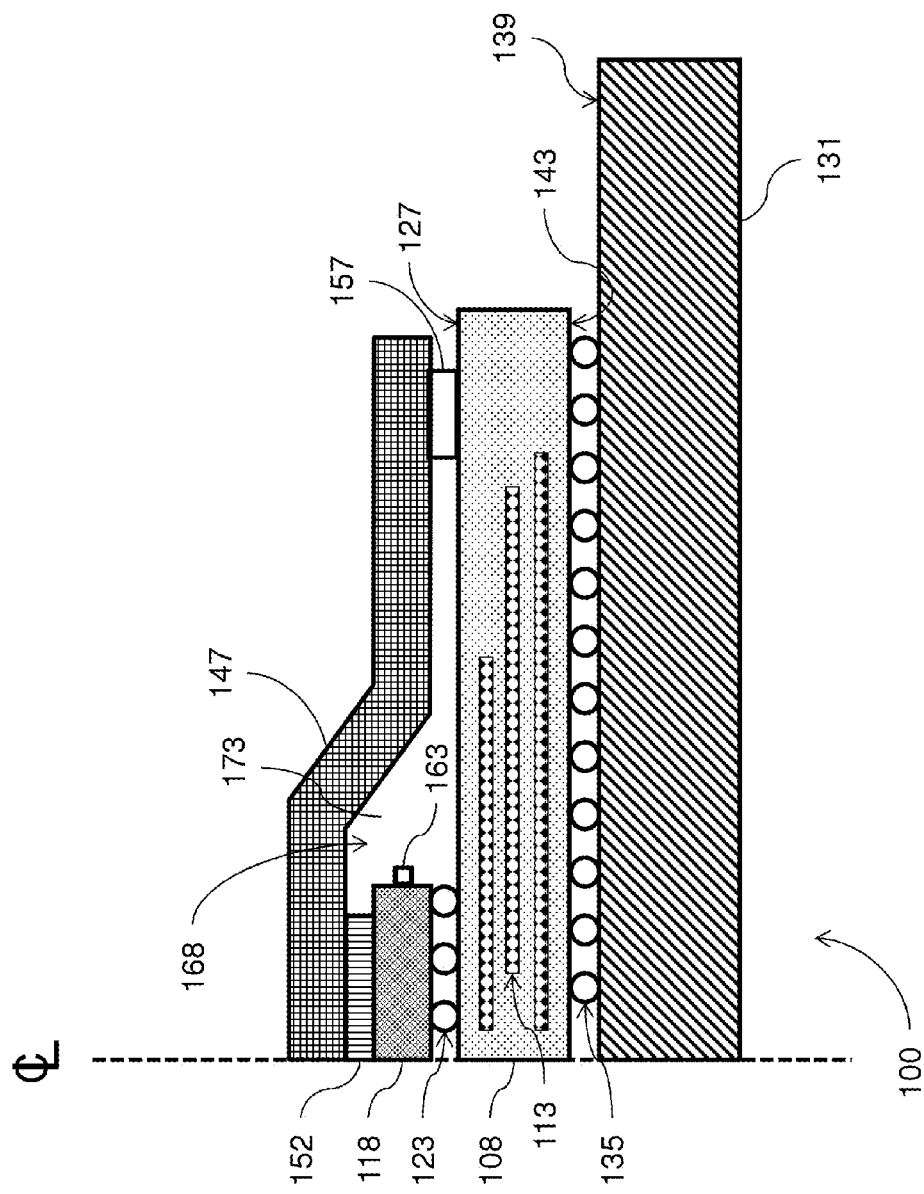
FIG. 1 is a cross-sectional view of a package structure illustrating devices and methods herein.

FIG. 1 is a cross-section view of a typically packaged electronic device, indicated generally as 100, taken about the centerline of the package. The electronic device 100 includes a laminate substrate 108 with electrical circuit wiring 113 thereon. At least one integrated circuit chip 118 is mounted on the laminate substrate 108. Mounting of the integrated circuit chip 118 may be done with a plurality of electrically conductive circuit members 123 positioned on a first surface 127 of the laminate substrate 108. The electrically conductive circuit members 123 may include controlled collapse chip connectors (C4s) or other devices known in the art. The electronic device 100 may include a single integrated circuit chip 118 or multiple chips. The laminate substrate 108 may be mounted onto a printed circuit board 131 by means of a ball grid array 135 or other means known in the art. As shown in FIG. 1, the ball grid array 135 is located between a top surface 139 of the printed circuit board 131 and a second surface 143 of the laminate substrate 108. The printed circuit board 131 provides module to module interconnect plus access to Input/Output devices.

The electronic device 100 may also include a lid 147, which is typically used to control substrate flexure and damage, but also provides a heat spreader for thermal management. According to devices and methods herein, the lid 147 may be made of a magnetocaloric material. The lid 147 may be bonded to the integrated circuit chip 118 through thermal interface material 152 and to the laminate substrate 108 through a connector 157.

The electronic device 100 may further include a temperature detector 163. The temperature detector 163 may be a thermocouple or other appropriate device as is known in the art.

As shown in FIG. 1, a cavity 168 may exist between the lid 147 and the laminate substrate 108. According to devices and methods herein, magnetocaloric material 173 may be provided in the cavity 168. The magnetocaloric material 173 may be selected from the group consisting of iron, cobalt, nickel, chromium, praseodymium, dysprosium, gadolinium, or combinations thereof. Non-limiting examples of effective magnetocaloric material include $Gd_5(Si_2Ge_2)$ and $PrNi_5$. The magnetocaloric material 173 may be placed around the integrated circuit chip 118 and around or over other package components. The placement of the magnetocaloric material 173 could be between the module and the heatsink (slug), the lid, the entire heatsink, or planes/features within the laminate substrate 108. The magnetocaloric material 173 can be incorporated as part of the module components or added during latter stages of manufacture of the structure. The magnetocaloric material 173 may be in the form of nano-fibers, nano-spheres, nano-ovals, nanowire, or other forms as is known in the art.

The magnetocaloric effect (MCE) is a reversible change in the temperature of a magnetizable magnetocaloric material in a magnetic field of variable intensity with the temperature rising or falling as the field intensity is increased or decreased, accordingly. A temperature change occurs when a magnetic field is applied to the magnetocaloric material under adiabatic conditions. In general, an isothermal application of a magnetic field decreases the configurational entropy of the spin structure of the magnetocaloric material, causing the material to heat up. A subsequent adiabatic demagnetization of the magnetocaloric material produces a spin re-disordering by the thermal energy provided by the phonon bath of the isolated sample. This causes cooling of the magnetocaloric material.

Magnetocaloric material can be used in a variety of ways within an integrated circuit structure. For example, as described above, the lid 147 may be made of magnetocaloric material. In other examples, a magnetocaloric slug can be placed between existing microelectronic components and a heatsink, or a magnetocaloric heatsink can be applied to existing microelectronic components. Additionally, other features in the substrate, printed circuit board, or wafer die can be fabricated, at least in part, from magnetocaloric material. It is contemplated that the devices and methods disclosed herein may be employed in a variety of fashions. For example, the magnetocaloric material 173 may be used in three-dimensional chip stacks, within through-silicon vias, or sandwiched between other chips. Such examples are intended to be non-limiting of the disclosure herein.

Figure 2:
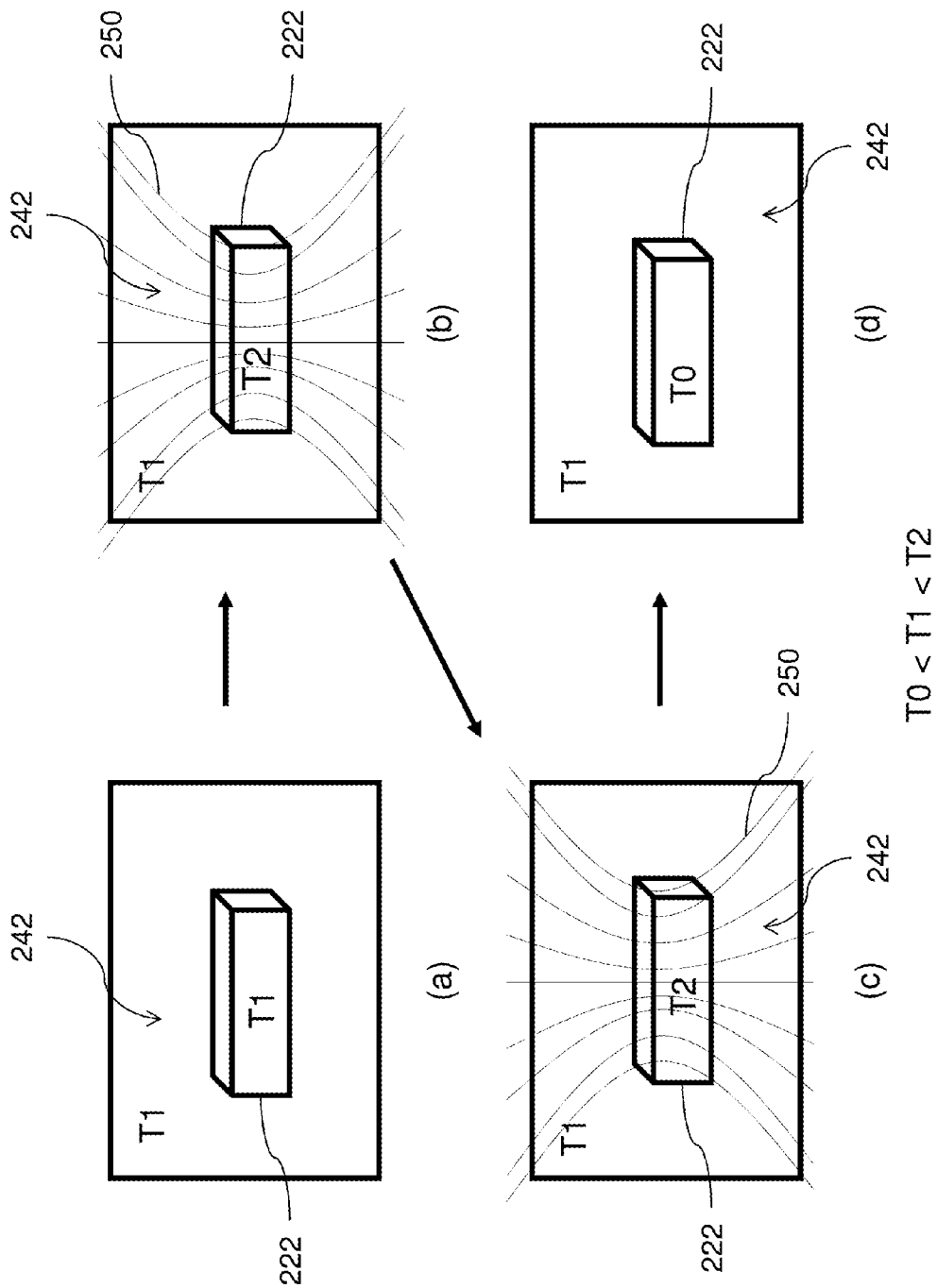
FIG. 2 is a flow diagram illustrating the magnetocaloric effect.

Using a magnetocaloric material, the microelectronics in the electronic device 100 can be heated or cooled in order to stabilize temperature in the electronic device 100 and to protect the integrated circuit chip 118 from extreme temperatures and temperature fluctuations. Referring to FIG. 2, magnetocaloric material and a controlled magnetic field can be used to stabilize the temperature of the integrated circuit chip 118. As shown in the portion of FIG. 2 labeled (a), a quantity of magnetocaloric material 222 begins at a stable temperature (T1) in equilibrium with its environment 242. In the portion of FIG. 2 labeled (b), the quantity of magnetocaloric material 222 is exposed to a magnetic field 250. The magnetic field 250 is generated by an appropriate magnetic field generator that could be external to the electronic device 100 or incorporated into the integrated circuit chip 118 or laminate substrate 108. The application of the magnetic field 250 causes the magnetic dipoles of the atoms in the magnetocaloric material 222 to align resulting in heating of the quantity of magnetocaloric material 222 to a higher temperature (T2). As shown in the portion of FIG. 2 labeled (c), the quantity of magnetocaloric material 222 heats up inside the magnetic field 250 (T2>T1) and loses thermal energy to the environment 242. As the magnetocaloric material 222 remains in a magnetic field 250 that is constant over time, the magnetic dipoles remain in alignment, therefore it stops heating up and eventually reverts to the same equilibrium temperature (T1) as the environment 242. As shown in the portion of FIG. 2 labeled (d), when the magnetic field is removed or reduced, the temperature of the quantity of magnetocaloric material 222 decreases to a lower temperature (T0), as the magnetic dipoles become disoriented. According to devices and methods herein T0<T1<T2.

Figure 3:
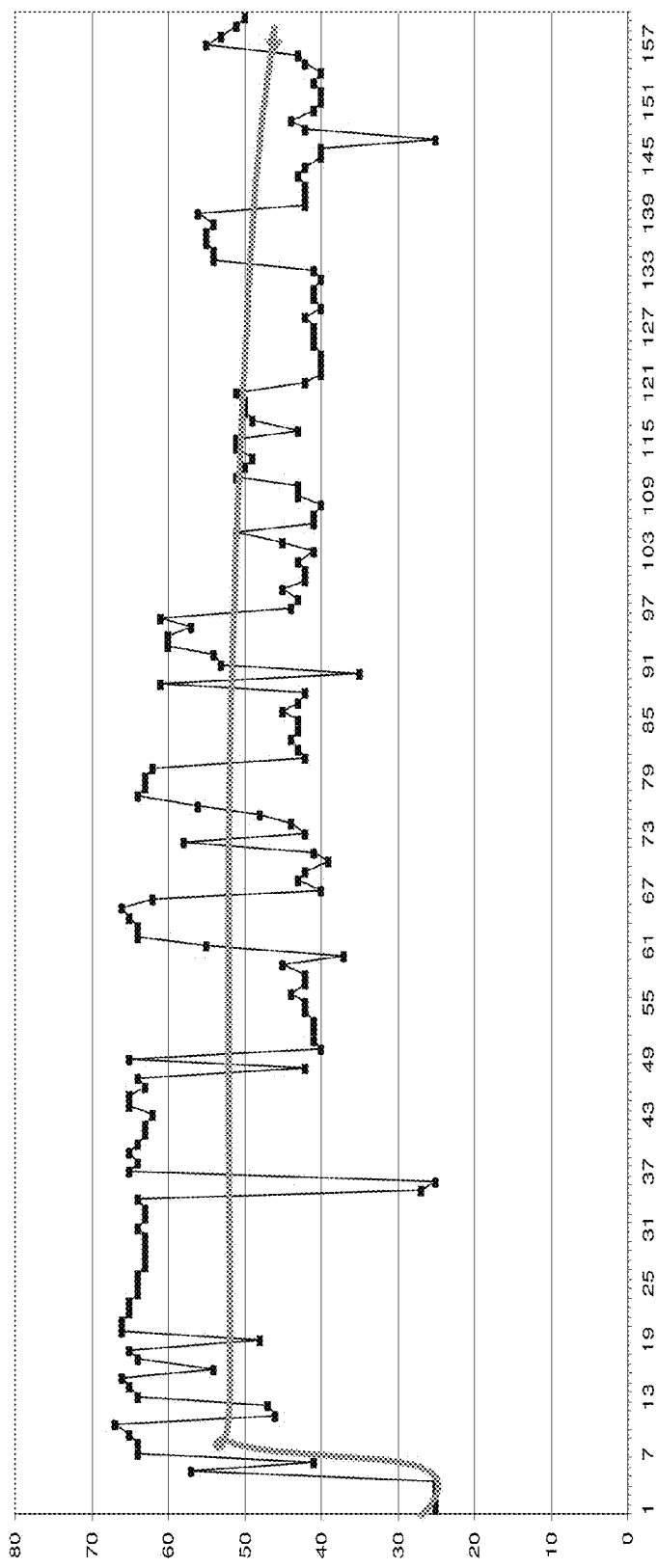
FIG. 3 is a graph illustrating temperature fluctuation in an integrated circuit structure.

Referring again to FIG. 1, according to devices and methods herein, the magnetocaloric material 173 may undergo a magnetic field at low temperatures to induce heating in its surrounding and the magnetic field may lessen or disappear at high temperatures to induce cooling to its surrounding. Doing this will heat the electronic device 100 (and the integrated circuit chip 118) at low temperatures, such as at initial chip startup. At high temperatures, such as during high stress conditions or turbo mode, the magnetocaloric material 173 may cool the electronic device 100. The magnetic field should be able to increase and decrease responsive to the temperature of the integrated circuit chip 118. Changes in the magnetic field (and therefore temperature) can be based on an internal temperature detector 163, such as a thermocouple, or based on power consumption of the electronic device 100. As shown in FIG. 3, using the magnetocaloric material 173, the electronic device 100 can be heated or cooled to stabilize the temperature without cycling and protect the part from extreme temperatures. For example, at start-up of the integrated circuit chip 118, a magnetic field of a predetermined intensity is applied to the electronic device 100, and with it, the magnetocaloric material 173. The magnetocaloric material 173 heats up and the temperature of the integrated circuit chip 118 increases to a stable equilibrium temperature. During operation, as the integrated circuit chip 118 heats up, the intensity of the magnetic field can be reduced causing the magnetocaloric material 173 to cool, thus inducing cooling in the electronic device 100. As the integrated circuit chip 118 cools down, the intensity of the magnetic field can be increased causing the magnetocaloric material 173 to heat, thus inducing heating in the electronic device 100. This method would reduce the amplitude of the sinusoidal heat cycle of the electronic device 100, thus improving reliability and performance of the integrated circuit chip 118.

In short, the magnetocaloric effect occurs when the magnetocaloric material is put in the presence of a magnetic field, causing the magnetocaloric material to heat. While still under the magnetic field, the magnetocaloric material dissipates heat into its surrounding until the magnetocaloric material returns to ambient temperature. (This happens when the ambient temperature is less than the temperature of the magnetocaloric material.) Then, when the magnetic field is reduced or eliminated, the temperature of the magnetocaloric material decreases. The magnetocaloric material now absorbs heat from its surroundings. (This happens when the ambient temperature is greater than the temperature of the magnetocaloric material).

Figure 4:
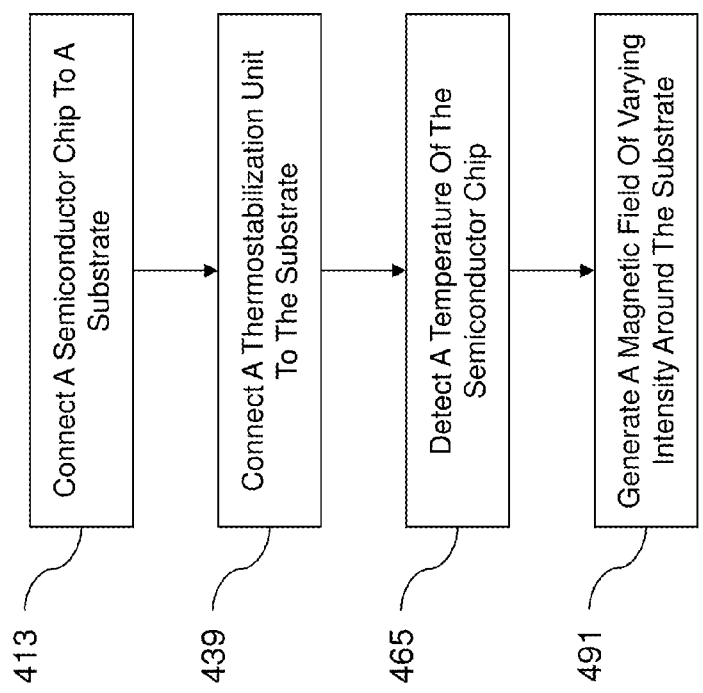
FIG. 4 is a flow diagram illustrating methods herein.

FIG. 4 is a flow diagram illustrating the processing flow of an exemplary method of fabricating an electronic package incorporating magnetocaloric materials in integrated circuit chip-carrier structures for electronic packages according to devices and methods herein. In item 413, a semiconductor chip is connected to a substrate. A thermostabilization unit is connected to the substrate, at 439. The thermostabilization unit comprises a temperature detector, magnetocaloric material on the substrate, and a magnetic field generator operatively connected to the temperature detector. In item 465, a temperature of the semiconductor chip is detected. In item 491, responsive to changes in temperature detected by the temperature detector, the magnetic field generator generates a magnetic field of variable intensity around the substrate to adjust temperature of the magnetocaloric material.

The method as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

Flip chip is a method for interconnecting semiconductor devices, such as IC chips, to external circuitry with solder bumps that have been deposited onto the chip pads. The solder bumps are deposited on the chip pads on the top side of the wafer during the final wafer processing step. In order to mount the chip to external circuitry (e.g., a circuit board or another chip or wafer), it is flipped over so that its top side faces down, and aligned so that its pads align with matching pads on the external circuit, and then the solder is flowed to complete the interconnect. This is in contrast to wire bonding, in which the chip is mounted upright, and wires are used to interconnect the chip pads to external circuitry.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

A hardmask can be formed of any suitable material, whether now known or developed in the future, such as a metal or organic hardmask, that has a hardness greater than the substrate and insulator materials used in the remainder of the structure.

The terminology used herein is for the purpose of describing particular devices and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein, are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various devices and methods of the present disclosure have been presented for purposes of illustration, but are not intended to be exhaustive or limited to the devices and methods disclosed. Many modifications and variations will be apparent to those of ordinary skill in the art without departing from the scope and spirit of the described devices and methods. The terminology used herein was chosen to best explain the principles of the devices and methods, the practical application or technical improvement over technologies found in the marketplace, or to enable others of ordinary skill in the art to understand the devices and methods disclosed herein.

What is claimed is:

1. An integrated circuit structure, comprising:
    a substrate;
    an integrated circuit chip on said substrate, said integrated circuit chip being electrically connected to said substrate;
    a thermostabilization unit physically connected to said integrated circuit chip and said substrate, said thermostabilization unit comprising:
        a temperature detector; and
        magnetocaloric material on said integrated circuit chip; and
    a magnetic field generator operatively connected to said temperature detector, said magnetic field generator generating a magnetic field of variable intensity responsive to changes in temperature detected by said temperature detector.

2. The integrated circuit structure according to claim 1, said magnetocaloric material being selected from the group consisting of:
    iron,
    cobalt,
    nickel,
    chromium,
    praseodymium,
    dysprosium,
    gadolinium, and
    combinations thereof.

3. The integrated circuit structure according to claim 1, said magnetocaloric material comprising at least one of nano-fibers, nano-spheres, nano-ovals, and nanowire.

4. The integrated circuit structure according to claim 1, said temperature detector comprising a thermocouple.

5. The integrated circuit structure according to claim 1, said magnetic field generator being external to said integrated circuit structure.

6. The integrated circuit structure according to claim 1, said magnetic field generator being incorporated into at least one of said integrated circuit chip and said substrate.

7. The integrated circuit structure of claim 1, further comprising a lid, said lid and said substrate forming a cavity therebetween, said magnetocaloric material being disposed within said cavity.

8. A method, comprising:
connecting a semiconductor chip to a substrate;
providing magnetocaloric material on said substrate;
connecting a temperature detector to said semiconductor chips;
detecting a temperature of said semiconductor chip using said temperature detector; and
connecting a magnetic field generator to said temperature detector, said magnetic field generator controlling a magnetic field of variable intensity around said substrate to adjust temperature of said magnetocaloric material responsive to changes in temperature detected by said temperature detector.

9. The method according to claim 8, said magnetocaloric material being selected from the group consisting of:
iron,
cobalt,
nickel,
chromium,
praseodymium,
dysprosium,
gadolinium, and
combinations thereof.

10. The method according to claim 8, said magnetocaloric material comprising at least one of nano-fibers, nano-spheres, nano-ovals, and nanowire.

11. The method according to claim 8, said temperature detector comprising a thermocouple.

12. The method of claim 8, said magnetic field generator generating said magnetic field external to said substrate.

13. The method of claim 8, further comprising:
said magnetic field generator generating said magnetic field, said magnetic field generator being incorporated into said substrate.

14. The method of claim 8, further comprising:
connecting a lid to said semiconductor chip, said lid and said substrate forming a cavity therebetween, said magnetocaloric material being disposed within said cavity.

15. A method, comprising:
connecting a semiconductor chip to a substrate;
connecting a thermostabilization unit to said substrate, said thermostabilization unit comprising:
a temperature detector;
magnetocaloric material on said substrate; and
a magnetic field generator operatively connected to said temperature detector;
said temperature detector detecting a temperature of said semiconductor chip; and
responsive to changes in temperature detected by said temperature detector, said magnetic field generator generating a magnetic field of variable intensity around said substrate to adjust temperature of said magnetocaloric material.

16. The method according to claim 15, said magnetocaloric material being selected from the group consisting of:
iron,
cobalt,
nickel,
chromium,
praseodymium,
dysprosium,
gadolinium, and
combinations thereof.

17. The method according to claim 15, said magnetocaloric material comprising at least one of nano-fibers, nano-spheres, nano-ovals, and nanowire.

18. The method according to claim 15, said temperature detector comprising a thermocouple.

19. The method of claim 15, said magnetic field generator being incorporated into said substrate.

20. The method of claim 15, further comprising:
connecting a lid to said semiconductor chip, said lid and said substrate forming a cavity therebetween, said magnetocaloric material being disposed within said cavity.

* * * * *